United States Patent [19]

Reick

[11] Patent Number: 5,180,706
[45] Date of Patent: Jan. 19, 1993

[54] HIGH-TEMPERATURE POROUS-CERAMIC SUPERCONDUCTORS

[76] Inventor: Franklin G. Reick, 228 West Pl., Westwood, N.J. 07675

[21] Appl. No.: 604,458

[22] Filed: Oct. 29, 1990

Related U.S. Application Data

[62] Division of Ser. No. 301,480, Jan. 26, 1989, Pat. No. 4,999,322.

[51] Int. Cl.⁵ ............... C04B 41/89; H01B 12/06; H01L 39/12; C01G 3/00
[52] U.S. Cl. ............................ 505/1; 505/785; 252/521; 501/152; 501/123
[58] Field of Search .......... 505/1, 785; 252/521; 501/152, 123

[56] References Cited

U.S. PATENT DOCUMENTS

| | | | |
|---|---|---|---|
| 4,897,378 | 1/1990 | Chiang | 505/1 |
| 4,931,427 | 7/1990 | Chien | 505/1 |
| 4,954,481 | 9/1990 | DeReggi et al. | 505/1 |
| 5,051,399 | 9/1991 | Yoshizumi et al. | 505/1 |

OTHER PUBLICATIONS

R. Dagani, "Superconductivity: A Revolution In Electricity Is Taking Shape" *CIEN* May 11, 1987, 7-16.
T. P. McAndrews et al., "Reaction of Organic Materials with $YBa_2Cr_3O_2$" Amer. Vac. Soc. 3, Conf Proceed 165, Nov. 6, 1987 451-455.
M. O. Eatoash, "Orthorhombic-Tetrogonal Phase Translation in High-Temperature Superconductor $YBa_2Cu_3O_7$" *Appl. Phy. Lett.* 51(5) Aug. 3, 1987 367-68.

*Primary Examiner*—William R. Dixon, Jr.
*Assistant Examiner*—Melissa Bonner
*Attorney, Agent, or Firm*—Michael Ebert

[57] ABSTRACT

A method for fabricating a high-temperature ceramic superconductor having a Y-Ba-Cu-O or other copper-oxide composition of comparable properties so as to render the ceramic porous to define interlaced diffusion channels throughout the entire body of the ceramic. As a consequence, oxygen, an essential component thereof, will in the course of firing the ceramic, diffuse throughout the interior of the body and thereby interact and become integrated with the crystal structure of the ceramic to form a superconductor having superior properties. The resultant porous ceramic body may be used as a superconductive device, or it may be ground into particles and dispersed as a filler in a binder acting as a plastic agent that can be extruded, molded, or otherwise shaped to create a Meisner-effect shield, a cylindrical superconductive bearing or other superconductive structure.

4 Claims, No Drawings

HIGH-TEMPERATURE POROUS-CERAMIC SUPERCONDUCTORS

RELATED APPLICATION

This application is a division of my pending application Ser. No. 301,480 of the same title, filed Jan. 26, 1989, now U.S. Pat. No. 4,999,322.

BACKGROUND OF INVENTION

This invention relates generally to high-temperature ceramic superconductors and to techniques for fabricating such superconductors; and more particularly to porous-ceramic superconductive bodies having superior characteristics.

STATUS OF PRIOR ART

For more than fifty years prior to the discovery in 1986 of high-temperature superconducting ceramics, superconductivity was defined as the property possessed by those metals and alloys which when subjected to temperatures approaching absolute zero exhibited zero electrical resistivity and became strongly diamagnetic.

The expression, "high-temperature superconductor," now applied to certain ceramic compositions, is an oxymoron or contradiction in terms. Though a room temperature superconductor may be a theoretical possibility, all presently known superconductive ceramics, without exception, function at distinctly low temperatures, far below the freezing point of water. But because these ceramics become superconductive at temperatures higher than those necessary to render metallic bodies superconductive, even though these higher temperatures are still extremely low, ceramic superconductors are nevertheless classified as being of the high-temperature type.

We shall begin our consideration of the phenomenon of superconductivity by examining the normal conduction of an electric current by a metal. A significant property of metals as contrasted to non-metals is their relatively large electrical conductivity. We know that current is transmitted by the motion of electrons driven though crystal lattices by applied electrical voltage. The electrons collide with the atoms in the lattice and this impedance to their motion constitutes the electrical resistance of the metal.

In general, resistance increases as the temperature goes up, for the vibrating atoms in the lattice then oscillate over wider distances from their lattice positions and interfere with the electron motion to a greater degree. Conversely, as the temperature of the metal declines, the conductivity generally increases.

An ideally pure metal will have infinite conductivity at absolute zero temperature ($-273°$ C.$=$K., where K. or Kelvin refers to the absolute temperature scale). However, an actual metal will possess imperfections, as a result of impurities, grain boundaries, lattice defects and other flaws. Consequently, the low temperature conductivity of an actual metal will rise only to a finite value, depending on the density of imperfections which scatter the electron current carriers and thereby limit conductivity.

There nevertheless exists a class of metals which in spite of impurities and other defects exhibits infinite conductivity or superconductivity below some finite transition temperature. It is important to bear in mind that the resistance of the material in the superconductive state is not merely extremely low, it is exactly zero within the limits of accuracy of any measurement yet devised. At the transition temperature for a metal superconductor which is a few degrees above absolute zero, there occurs a thermodynamic transition into the superconducting state. This transition temperature is not the same for all superconductive metals.

Another characteristic peculiar to metals in the superconducting state is the fact that they are perfectly diamagnetic; i.e., impervious to a magnetic field. When a superconductor is subjected to a magnetic field, the lines of the magnetic force are expelled, as contrasted to ferromagnetic materials which concentrate the lines of force. The expulsion of magnetic flux from the interior of a body of superconducting material as the material undergoes the transition to the superconducting phase is known as the Meisner effect.

Industrial, medical and scientific uses heretofore found for metallic superconductors have been limited to highly specialized applications, this being due in good part to problems and costs associated with maintaining these superconductors at a liquid helium temperature. Thus superconducting metallic magnets are in use in nuclear magnetic resonance (NMR) medical diagnostic equipment, in high energy particle accelerators requiring high magnetic fields, as well as in SQUIDs to detect extremely weak magnetic fields, such as those emanating from the human brain. But their more widespread use is inhibited by severe liquid helium requirements.

Thus in a SQUID, a superconducting loop incorporates a "weak link" highly sensitive to the magnetic field encompassed within the loop area, a detection coil being tightly coupled to the loop to act as a flux transformer. Both the coil and loop are immersed in a bath of liquid helium contained within a dewar, as a consequence of which the SQUID is a relatively bulky device. As a practical matter, it is not possible to bring more than one SQUID into the vicinity of a subject's brain. But brain studies for mapping the magnetic fields emanating at various brain sites require for this purpose several sensors.

The practical limitations of metallic superconductors have also discouraged their use in digital computers. Thus, as early as 1958 the use of such superconductors as memory elements and directional switches in computers was suggested (see Buckingham et al. U.S. Pat. No. 3,043,512). However, the need in the environment of a computer to maintain superconductor devices at a liquid helium temperature has militated against this application on a commercial scale.

The discovery of Bednorz and Muller of high-temperature (30K) superconductivity in a La-Ba-Cu-O system is a historic advance, for the resultant copper-oxide ceramic opened up a range of possible industrial, scientific and medical applications that could not be realized with low-temperature superconductors.

This fundamental discovery was succeeded not long after by the development of compositions exhibiting the onset of superconductivity at about 40K, a step forward beyond Bednorz and Muller. A far more dramatic subsequent development was the discovery of a related class of copper oxides alloyed with yttrium and barium, for these compounds have critical temperatures ($T_c$) above 90K. ($T_c$ is the temperature at which resistance drops to zero.) The striking advantage gained by this development is that yttrium-based compounds can be rendered superconductive in liquid nitrogen (77K), a far less costly cryogenic agent than liquid helium. Hence, this represents a breakthrough of extraordinary significance.

Major figures in the evolution of high-temperature ceramic superconductors are Chu and Wu of the University of Houston; for they found that the optimum composition appears to be the "1-2-3" compound $Y Ba_2 Cu_3 O_x$; where x is about 7. It is mainly Y-Ba-Cu-0 compounds that are undergoing current refinements by researchers seeking still higher $T_c$ temperatures.

For a general review of high-temperature, ceramic superconductor developments, reference is made to the 1988 publication of Nature, an international weekly journal of science entitled "High Temperature Superconductors in Nature." In this publication, the many articles written on this subject that appeared in various issues of Nature are assembled into a single volume.

The conventional technique for making high-temperature ceramic superconductors is to subject powders to extreme pressures to form a solid ceramic body of the highest possible density. This practice is based on the supposition that optimum electrical and magnetic properties are attainable in this manner.

Thus in the article, "Shock Compression Fabrication of High-Temperature Superconductor/Metal Composite Monolith" by Muir et al.—Nature, Vol. 329-3, September 1987, superconductive powders are consolidated, sintered and bonded onto a substrate using nitrate-based explosives to effect shock consolidation.

We have found, however, that in making a highly densified superconductive ceramic body, the virtual absence of pores therein inhibits diffusion through its interior of oxygen, an essential component of the crystal structure of the superconductor. As pointed on the article by Cava et al. of Bell Laboratories, "Oxygen Stoichiometry Superconductivity and Normal State Properties of $Y Ba_2 Cu_3 O_7$" appearing in Nature, Vol. 329, Oct. 1, 1987, "the most unusual crystal-chemical aspect of the new high temperature oxide superconductors is their significant variability in oxygen content."

In this article, the authors present data indicating that the distribution of oxygen over the available sites in the ceramic structure plays an important role in determining the characteristics of the high-temperature superconductor.

Also of background interest is the article by Ovshinsky et al., "Superconductivity at 155K" in Physical Review Letters, Vol. 58, No. 24 (June 15, 1987), in which the authors report observing a zero-resistance state at 155K in a fluorinated Y-Ba-Cu-O system.

SUMMARY OF INVENTION

In view of the foregoing, the main object of this invention is to provide a technique for producing a high-temperature ceramic superconductor having a Y-Ba-Cu-O or another copper oxide composition affording comparable properties so as to render the body of the ceramic porous to define interlaced diffusion tunnels or channels.

A significant advantage of this technique is that oxygen, an essential component of the superconductor, is free to diffuse throughout the interior of the ceramic body in the course of its firing, and thereby react and become integrated with its crystal structure to form a superconductor having superior characteristics.

Also an object of the invention is to provide a porous, superconducting ceramic body that lends itself to grinding into granules without disrupting their crystal structure, which granules can then be dispersed as a filler in a binder acting as a plastic agent, making it possible to extrude, mold or otherwise create shaped superconductive structures such as cylinders and helixes, or to form thin superconductive layers having high Meissner or shielding effects.

Yet another object of the invention is to provide a composition for creating a superconductive ceramic which includes a fluorocarbon resin that acts in the course of fabricating the ceramic as a mold lubricant and release agent and in the course of firing the ceramic as a flux to promote sintering. The final product includes a fluoride component that may raise the transition temperature.

Briefly stated, these objects are attained in a technique wherein powders in a proper stoichiometric ratio to constitute the essential components of a composition forming a high-temperature ceramic superconductor are mixed together to provide a stock mixture. This mixture is then fired in a crucible to yield a sintered clinker. The clinker is then ground into fine particles to provide precursor particles which are intermixed with cellulosic fibers to form a master mixture that is compressed to form a fiber-reinforced green pellet.

The pellet is fired in air in a furnace at a temperature causing the fibers to burn out and thereby define interlaced diffusion channels throughout the body of the pellet, and then at a higher temperature in flowing oxygen for a period sufficient to cause the compressed particles to sinter together, during which period the oxygen diffuses through the channels to interact and integrate with the crystals of the porous ceramic body. This body is usable as a superconductor or it can be ground into granules without disrupting the crystal structures and dispersed as a filler in a binder acting as a plastic agent which can be extruded, molded or otherwise shaped to create superconductive cylindrical bearings, Meisner-effect shields and other useful superconductive structures which need not be electrically conductive.

Also included in the master mixture is a fluorocarbon resin that acts as a lubricant to facilitate its compression a mold and as a release agent for the mold, and which in the course of firing produces a fluorine vapor to promote sintering of the granules.

DESCRIPTION OF INVENTION

In fabricating porous, ceramic, high-temperature superconductors according to the invention having superior properties, the following steps are involved:

STEP I

Precursor

The basic ingredients used are those known in the literature for making ceramics having 1-2-3 Ox structures. A preferred composition is yttrium oxide, barium carbonate and copper carbonate in the proper stoichiometry. Instead of yttrium, europium or other rare earth metal may be used.

As an example of how a precursor is created, first 33.16 grams of copper carbonate and 11.3 grams of yttrium oxide are thoroughly mixed in an air blender or by similar means. Then 39.5 grams of barium carbonate are added and mixed in the air blender to form a basic stock mixture.

This stock mixture is then fired in an alumimum-oxide crucible in dry air for about 4 hours at a temperature of 950° C. to form a small sintered brick of clinker. This clinker is then ground up by a mortar and pestle or similar means to produce fine particles, about 90 percent of which will pass through a 200 mesh sieve to yield the desired precursor particles.

STEP II

Pellets

Precursor particles yielded in Step I are intermixed in an air blender with ash-free, spectrograph grade, dry cellulose fibers (free of ash) in an amount sufficient to create when firing takes place in STEP III, a network of interlaced diffusion channels or tunnels distributed through the entire body of the ceramic. Also added is a trace amount of a fluorocarbon resin powder such as TFE or TEFLON (tetrafluoroethylene) to produce a pellet-forming master mixture.

This pellet-forming master mixture is then compressed at 30 tons in a two centimeter steel die to produce a fiber-reinforced green pellet in which the cellulosic fibers are distributed throughout the body of the green pellet. But the fibers which are brittle have lost their integrity; for in the course of compression, they are crushed and shattered.

STEP III

Ceramic Wafers

Green pellets produced by STEP II are stacked on copper mesh screens which have been oxidized to form a rigid copper oxide ceramic support that will not contaminate the green pellets The stacking is such as to permit gasses to flow freely around the pellets.

The screen-supported stacked green pellets are heated in a silicon-carbide electric resistance tube furnace into which dry air is fed at one end of the furnace at a relatively slow rate. The pellets stacked on the screens are heated slowly to about 400° C. to allow the pulverized cellulosic fibers embedded therein to burn out slowly, and thereby leave voids creating interlaced diffusion channels or tunnels that are distributed throughout the entire body of the pellet.

The gas fed into the furnace is then switched to $O_2$ (diatomic molecules of oxygen) and in some cases to $O_3$ (ozone—a triatomic form), and the pellets are now heated over a three hour period at 950° C. The temperature is then gradually raised to 975° C. for a five hour period, the oxygen continuing to flow.

At the conclusion of the 5-hour period, the furnace is turned off and allowed slowly to cool for about 12 hours in flowing oxygen or ozone. The pellets are now in the form of black buttons or wafer-shaped bodies which are quite porous. As seen under 100× magnification, a network of diffusion channels or tunnels is perceptible. The ceramic grains are bonded together and are electrically continuous to provide zero resistance when the body is rendered superconductive at liquid nitrogen temperature.

FLUOROCARBON RESIN

The precursor produced in STEP I which incorporates cellulose fibers therein also includes a trace amount of fluorocarbon resin powders (Teflon). When the precursor compacted in a mold in STEP II to form a green pellet, the resin then functions as a mold lubricant to enhance compaction of the granules and fibers. It also acts as a release agent for the mold.

When green pellets are thereafter fired at high temperature in STEP III, the resin then volatilizes to form a fluorocarbon gas that reduces the surface temperature of the granules and acts as a solder to promote sintering to assure intimate contact between grains. It is believed to also act as a crystallization flux. And the fluorocarbon provides a fluoride component that may raise the critical temperature of the superconductor.

THE CELLULOSE FIBERS

The cellulose fibers, in acting to create throughout the body of pellets in the course of firing in STEP III interlaced diffusion tunnels, permit the oxygen flowing in the furnace to diffuse throughout the porous body of the pellet and becomes part of its crystal structure. This results in a porous superconductor of high quality exhibiting an extraordinarily strong Meisner effect. Thus in a comparison test run on a superconductive ceramic wafer made with ash-free cellulose fiber and a similar wafer having the same ceramic ingredients but lacking such fibers, it was found that the first wafer produced a Meisner-effect levitation more quickly than the second wafer, and a distinctly higher elevation.

The reason why the porous ceramic provides a greater Meisner effect is that the cryogenic liquid to render it superconductive penetrates the pores of the ceramic and superconductivity is not confined to its surface.

Another advantage of a porous ceramic superconductor is that it facilitates effective electrical contact therewith. Electrical contacts for the porous ceramic body may be provided by applying thereto a silver or gold-based paint which soaks into the body to create a contact in depth, rather than one just on the surface, as in a non-porous ceramic.

APPLICATIONS

The ceramic superconductive body described hereinabove has a form dictated by the mold in which it is formed. However, one can use this body to provide superconductive powders that can then be dispersed as a filler in a plastic molding compound or binder to create shaped superconductor structures in any desired form.

To this end, the porous superconductor ceramic body is ground into granules. Because of the porosity of the body, the grinding action is accompanied by much less heat than if performed on a solid body and it does not act to destroy the crystals. The resultant granules are then dispersed as a filler in a suitable binder acting as a plastic agent. This binder may be silicone-rubber epoxy, or polyester, the binder serving as a matrix for the dispersed grains. Thus by suitable extrusion and molding techniques, one can make superconductive Meisner-effect shields, superconductive cylindrical bearings or other devices in various geometric forms. Or one can coat a superconductive layer on a substrate. In such molded structures, the Meisner-effect is confined to individual grains containing electron vortices. Tracks, rails, levitation areas and bearings can be made in this manner with conventional plastic molding and extruding machines or by painting. And the parts are easily machined. The sacrifice is only in bulk electrical conductivity, for the superconductive particles are electrically insulated from each other more or less.

A percolating wick feed for liquid nitrogen can be used to cool remote porous superconductors and large areas thereof quite effectively. A hollow spheroid or cylinder of superconductor material can be molded with the internal surfaces shielded by the Meisner effect. It might be thought of as the DC magnetic analog of the Faraday cage with the interior constituting a "Meisner space." AC fields are transmitted with minor attenuation. Particle size and distribution have a profound effect on final magnetic and electrical characteristics.

While there have been disclosed preferred techniques for fabricating porous ceramic, high-temperature superconductive bodies, and superconductor devices made by these techniques, it is to be understood that the invention is not limited to the examples disclosed, for the underlying concept is applicable to other formulations for high-temperature ceramic superconductors. In practice, it is essential that the cellulose fibers be ash-free to avoid contamination of the ceramic. Also, the ratio by weight of the cellulose fibers to the powder ingredients in the master mixture is about $\frac{1}{4}$ to 5 percent, depending on the desired degree of porosity.

I claim:

1. A high-temperature copper-oxide ceramic superconductive body having a porous structure defined by interlaced diffusion tunnels that extend throughout the body and communicates with its exterior to facilitate oxygenation of the body during its production and to render it superconductive when the tunnels are thereafter penetrated by a cryogenic coolant that reduces the temperature of the body to a level at which it exhibits superconductive properties.

2. A superconductive body as set forth in claim 1, in which the ceramic body is formed by a rare earth oxide in combination with barium carbonate and copper carbonate in a stoichiometric ratio that renders the ceramic superconductive at the temperature of liquid nitrogen.

3. A superconductive body as set forth in claim 2, wherein said rare earth is yttrium oxide.

4. A superconductive body as set forth in claim 1, formed of a highly-densified porous body of superconductive particles that are sintered together.

* * * * *